(12) United States Patent
Ohashi

(10) Patent No.: US 6,768,653 B2
(45) Date of Patent: Jul. 27, 2004

(54) MOUNT STRUCTURE

(75) Inventor: Yoshiyuki Ohashi, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 10/323,934

(22) Filed: Dec. 20, 2002

(65) Prior Publication Data
US 2003/0123241 A1 Jul. 3, 2003

(30) Foreign Application Priority Data
Dec. 28, 2001 (JP) .......................................... 2001-400403

(51) Int. Cl.$^7$ .............................................. H05K 7/12
(52) U.S. Cl. ........................ 361/807; 361/801; 361/730
(58) Field of Search ................................. 361/807, 808, 361/809, 730, 801; 257/726, 727

(56) References Cited

U.S. PATENT DOCUMENTS

| | | | | |
|---|---|---|---|---|
| 5,715,142 A | * | 2/1998 | Jaeger et al. ............... | 361/718 |
| 5,978,229 A | * | 11/1999 | Kim ............................ | 361/760 |
| 6,172,593 B1 | * | 1/2001 | Mochida et al. .......... | 338/22 R |
| 6,296,504 B1 | * | 10/2001 | Ohashi ....................... | 439/266 |
| 6,303,974 B1 | * | 10/2001 | Irons et al. ................. | 257/584 |

* cited by examiner

*Primary Examiner*—David Martin
*Assistant Examiner*—Dameon E. Levi
(74) *Attorney, Agent, or Firm*—Staas & Halsey LLP (57) ABSTRACT

A mount structure for two members is applicable to a mount structure between a socket body as one member and an operation member as another member, which are relatively movable in their contacting or separating direction. A plate-shaped engaging piece extends from the operation member along the side surface of the socket body and is formed with an opening window, into which a projection formed to the side surface of the socket body is inserted. A coming-off prevention mechanism for preventing the engaging piece from coming off from the projection is provided between the side edge portion of the opening window peripheral edge and the side edge portion of the projection.

11 Claims, 6 Drawing Sheets

PRIOR ART

MOUNT STRUCTURE

BACKGROUND OF THE INVENTION

1. Field of the Invention

The present invention relates to a mount structure for one and another member which are mounted to be relatively movable in direction contacting to or separating from each other.

2. Related Art of the Invention

As such mount structure, there has been provided in prior art an IC socket mounted with an IC package for performing a burn-in test.

As such IC package, there is provided, for example, a BGA (Ball Grid Array) type one, having a structure in which a number of solder balls as spherical terminals are disposed to the lower surface of an IC package body in a grid arrangement having vertical and horizontal rows.

On the other hand, the IC socket is so-called an open-top type one having a socket body to which the IC package is mounted and accommodated, and to which contact pins are disposed so as to be contacted to or separated from terminals of the IC package. Moreover, an operation member for elastically deforming the contact pins so as to be contacted to or separated from the terminals of the IC package is disposed to be vertically movable with respect to the socket body.

Figure 10:
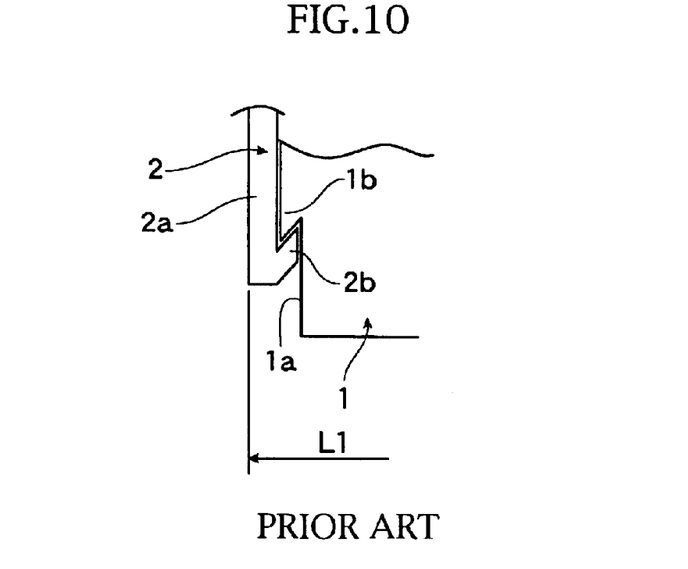
FIG. 10 is a side view showing a conventional structure of an engagement portion of a socket body and an engaging piece of an operation member.

FIG. 10 represents a mounting condition of the socket body and the operation member. That is, with reference to FIG. 10, the socket body 1 is formed with engagement portion (i.e., portion to be engaged) 1b at the side surface 1a thereof, and on the other hand, the operation member 2 is provided with an engaging piece 2a extending downward, in an illustrated state, along the side surface 1a of the socket body 1. The engaging piece 2a is formed, at its lower end, with a hook portion 2b, which is engaged with the engagement portion 1b of the socket body 1.

In such conventional mount structure, however, as the engaging piece 2a of the operation member 2 is disposed along the outside of the engagement portion 1b of the socket body 1, an outer diameter L1 of the mount structure becomes large. In addition, in the illustrated structure, the hook portion 2b is engaged with the engagement portion 1b at the uppermost position of the operation member 2, and accordingly, at the other positions during the vertical motion of the operation member 2, the hook portion 2b is not engaged with the engagement portion 1b. In order to avoid such disengaging state from causing during the vertical motion of the operation member 2, another engaging member may be located or a guide member may be further disposed, complicating the structure and being disadvantageous.

SUMMARY OF THE INVENTION

An object of the present invention is to therefore eliminate defects or drawbacks encountered in the prior art mentioned above and to provide an improved mount structure having a simple structure suitable for preventing disengagement during relative movement of members even with no specific guide means or like.

This and other objects can be achieved according to the present invention by providing a mount structure for one and another members which are relatively movable in a direction contacting to or separating from each other, wherein the one member is provided with an engaging piece in the form of plate so as to extend along a side surface of the another one member, the engaging piece being formed with an opening window, and the another one member is provided, at a side surface thereof, with a projection which is to be inserted into the opening window formed to the engaging piece of the one member, the opening window having a peripheral edge including a side edge portion extending along the contacting or separating direction, the projection having a side edge portion extending along the contacting or separating direction, and a coming-off prevention mechanism for preventing the engaging piece from coming off from the projection is provided between the side edge portion of the opening window peripheral edge and the side edge portion of the projection.

In a preferred embodiment of this aspect, the coming-off prevention mechanism includes a slide groove formed to the side edge portion of the projection and the side edge portion of the opening window peripheral edge is inserted into the slide groove formed to the side edge portion of the projection when the one and another one members are relatively moved. When the one and another members are relatively moved in the separating direction, one side portion of the peripheral edge of the opening window abuts against the projection and then the relative movement stops and, on the other hand, when the one and another members are relatively moved in the contacting direction, another one side portion of the peripheral edge of the opening window abuts against the projection and then the relative movement stops.

In a specific example, the one member is a socket body of an IC socket and the another one member is an operation member disposed to be movable with respect to the socket body, the socket body being provided with a contact pin which is electrically connected to a terminal of an IC package and when the operation member is moved, the contact pin is elastically deformed so as to be contacted to or separated from the terminal.

That is, in more specific aspect, the present invention provides a mount structure of a socket for an electrical part in which the socket includes a socket body and an operation member mounted to the socket body, wherein the operation member is provided with an elastic piece extending from a side surface of the operation member along a side surface of the socket body, the elastic piece being formed with an opening, and the socket body is provided with a projection projecting from the side surface thereof so as to be inserted into the opening of the elastic piece, the opening having a size in which the projection is movable by a predetermined amount.

The operation member has a rectangular frame structure and the elastic piece extends from each side surface of the rectangular operation member along each side surface of the socket body.

According to the present invention of the characters mentioned above, one member provided with the engaging piece extends along the side surface of the another one member, the engaging piece being formed with an opening window, and another one member being provided, at a side surface thereof, with a projection which is to be inserted into the opening window. The opening window has a peripheral edge including a side edge portion extending along the contacting or separating direction, and the projection has a side edge portion extending along the contacting or separating direction, and a coming-off prevention mechanism for preventing the engaging piece from coming off from the projection is provided between the side edge portion of the opening window peripheral edge and the side edge portion of the projection. Thus, the disengagement of the engaging piece from the projection can be prevented under the proper guidance during the relative movement of the two members, and the outer dimension or size can be made smaller, thus making compact the structure.

Moreover, according to the mount structure of the present invention, when one and another members are relatively moved in the separating direction, one side portion of the peripheral edge of the opening window abuts against the projection and then the relative movement stops and, on the other hand, when the one and another members are relatively moved in the contacting direction, another one side portion of the peripheral edge of the opening window abuts against the projection and then the relative movement stops. Thus, the stroke amounts of both members can be determined in accordance with the sizes of the opening window and the projection with no other specific stopping member or mechanism, thus also making simple the structure.

In the aspect that the present invention is applied to the IC socket, entire structure can be made more compact, thus being advantageous.

The nature and further characteristic features of the present invention will be made more clear from the following descriptions made with reference to the accompanying drawings.

BRIEF DESCRIPTION OF THE DRAWINGS

In the accompanying drawings:

FIG. 8 includes FIG. 8A showing a sectional view of a state that both contact portions of a contact pin according to the embodiment shown in FIG. 1 are closed and FIG. 8B showing a sectional view of a state that both the contact portions are opened;

FIG. 9 includes FIG. 9A showing a front view of an IC package for the embodiment shown in FIG. 1 and FIG. 9B showing a bottom view thereof.

DESCRIPTION OF THE PREFERRED EMBODIMENT

A preferred embodiment of the present invention will be described hereunder with reference to FIGS. 1 to 9B of the accompanying drawings.

Figure 9A:
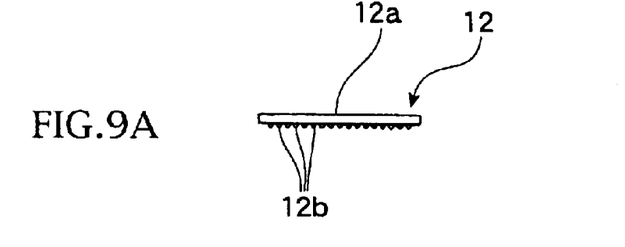
Figure 9B:
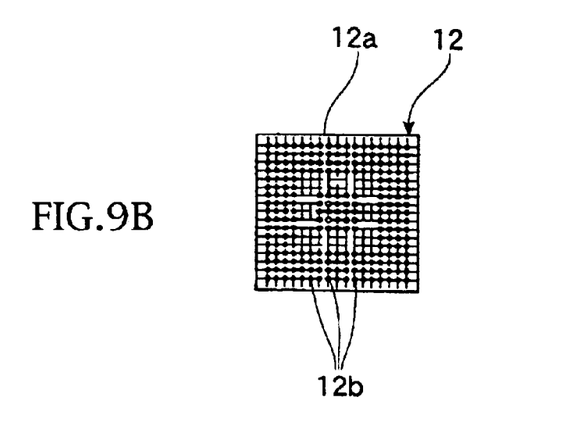

In all the drawings, reference numeral 11 denotes an IC socket to which the present invention is applicable. This IC socket 11 is a device (member) for achieving an electrical contact of a solder ball 12b as a "spherical terminal" of an IC package 12 as an "electrical part", such as shown in FIGS. 9A and 9B, and a printed circuit board of a measuring device such as a tester, not shown, for carrying out a performance test of the IC package 12.

This IC package 12 is so-called a BGA (Ball Grid Array) type one, in which a number of solder balls 12b as "terminals" are arranged to the lower surface of a rectangular package body 12a of the IC package 12 in an arrangement of matrix having vertical and horizontal rows.

On the other hand, the IC socket 11 has a socket body 13 made of resin and mounted on a printed circuit board, not shown, and to this socket body 13, there are arranged a number of contact pins 15 which are contacted to or separated from solder balls 12b as terminals of the IC package 12. The socket body 13 is also provided with a movable member 17 for elastically deforming the contact pins 15. A top plate 19 is fixed to the socket body 13 at a portion above the movable member 17, and an operation member for moving the movable member 17 in the lateral direction is also mounted to the socket body 13 to be vertically movable (i.e., contacting or separating direction) with respect to the socket body 13. Further, it is to be noted that, in the described embodiment, the socket body 13 is referred to as "one member" and the operation member 21 is referred to as "another member", which are mounted or coupled to each other. It is also to be noted that the terms of "upper", "lower", "right", "left" or like are used herein with reference to the illustration of the drawings or in a using state of the socket.

The contact pins 15 are formed from a plate member, through press-working, having springy property and being excellent in conductivity.

Figure 3:
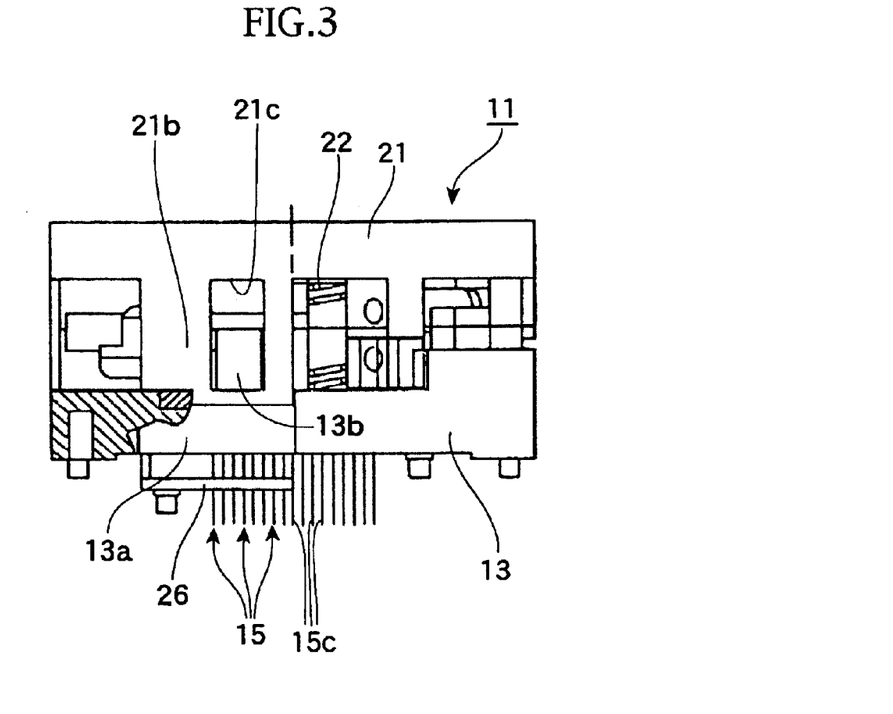
FIG. 3 is a front view, partially in section, of the IC socket of the embodiment shown in FIG. 1.
Figures 8A, 8B:
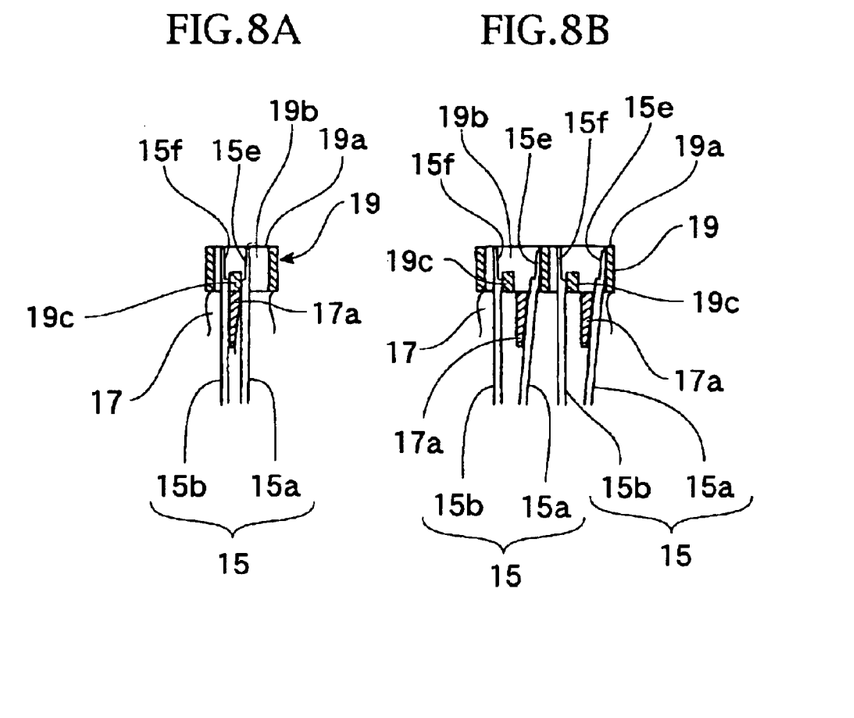

Each of the contact pins 15 comprises a pair of movable side elastic piece 15a and stationary side elastic piece 15b, as shown in FIGS. 8A and 8B, one solder tail portion 15c, as shown in FIG. 3, integrally formed to the lower portions of the elastic pieces 15a and 15b, and contact portions 15e and 15f formed to the upper ends (front ends) of the elastic pieces 15a and 15b, respectively. These contact portions 15e and 15f contact to or separate from side surface of the solder ball 12b of the IC package, and when the solder ball 12b is clamped by these contact portions 15e and 15f at its side portions, the electrical connection (conductivity) between the contact pin 15 (i.e., socket body 13) and the solder ball 12b (i.e., IC package 12) is established.

The contact pins 15, each of such structure as mentioned above, are press-fitted to the socket body 13 so that the solder tail portions 15c project downward, as shown in FIG. 3, from the socket body 13, and then project further downward through a location board 26, the projected ends of the solder tail portions 15c being inserted through through holes formed to the printed circuit board, not shown, and then soldered thereto, thus establishing the electrical connection between the contact pins 15 and the printed circuit board.

These contact pins 15 are arranged, as like as the solder balls 12b of the IC package 12, in the form of grid having vertical and horizontal rows at a pitch equal to that of the solder balls 12b.

With reference to FIGS. 8A and 8B, the movable member 17 is disposed to the socket body 13 to be horizontally (bilateral direction as viewed) movable, and when this movable member 17 is moved, the movable side elastic pieces 15a of the contact pins 15 are elastically deformed and then displaced to the state shown in FIG. 8B.

The movable member 17 is moved in accordance with the vertical motion of the operation member 21 via members or mechanism not shown, and the movable member 17 is provided with a pressing portion 17a for pressing and elastically deforming the movable side elastic piece 15a.

On the other hand, the top plate 19 has a mount surface portion 19a on which the IC package 12 is mounted as shown in FIG. 1, 2, 8A or 8B. The mount surface portion 19a is formed with accommodation holes 19b, in conformity with the pitch of the contact pins 15, into which the paired contact portions 15e and 15f are accommodated as shown in FIGS. 8A and 8B. In each of the accommodation holes 19b, a positioning rib 19c is formed to be inserted between the paired contact portions 15e and 15f, and when any external force is not applied to both the elastic pieces 15a and 15b of the contact pin 15 (that is, in a state that both the contact portions 15e and 15f are closed), the positioning rib 19c takes a position clamped by both the elastic pieces 15a and 15b.

Figure 1:
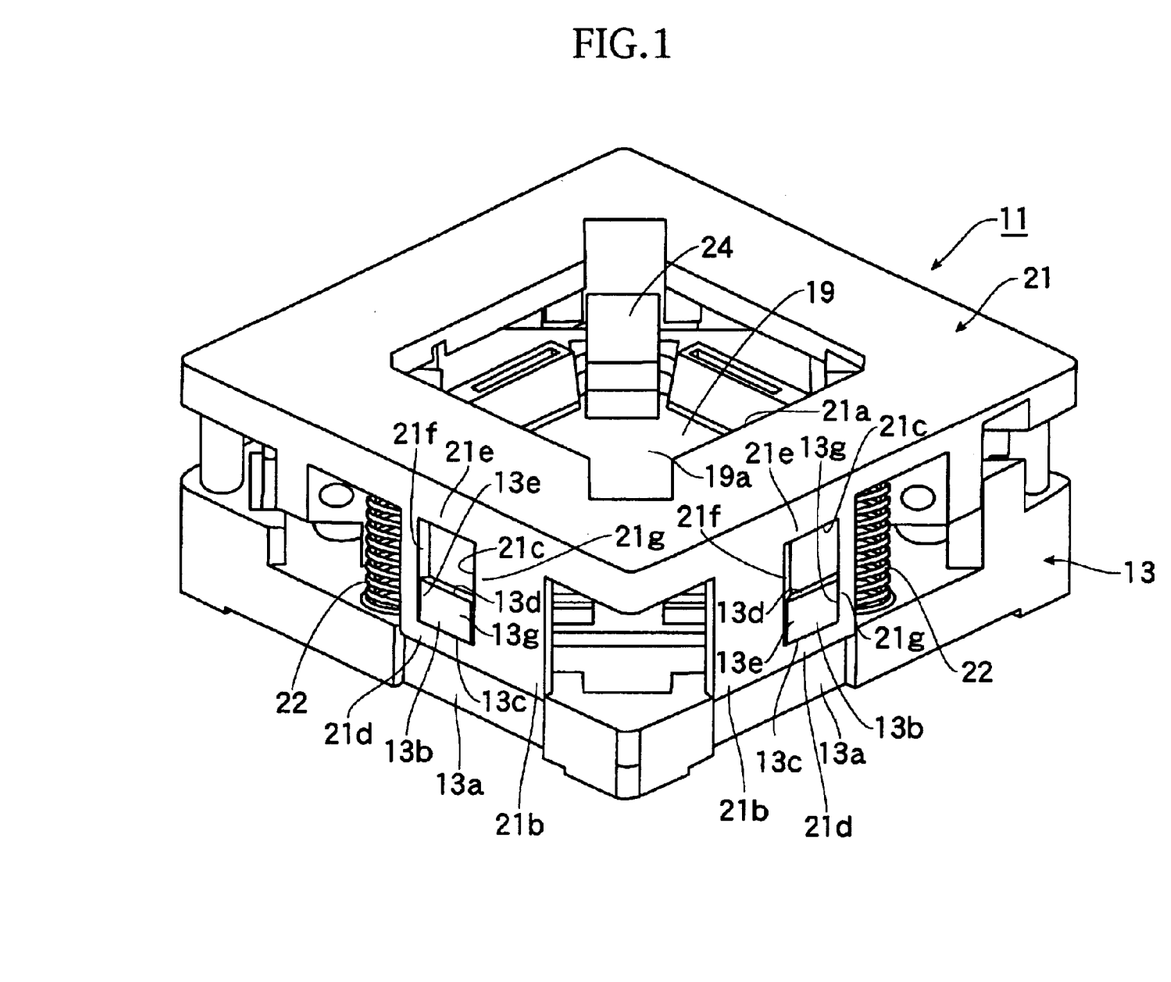
FIG. 1 is a perspective view of an IC socket as one embodiment showing a mount structure of the present invention.
Figure 2:
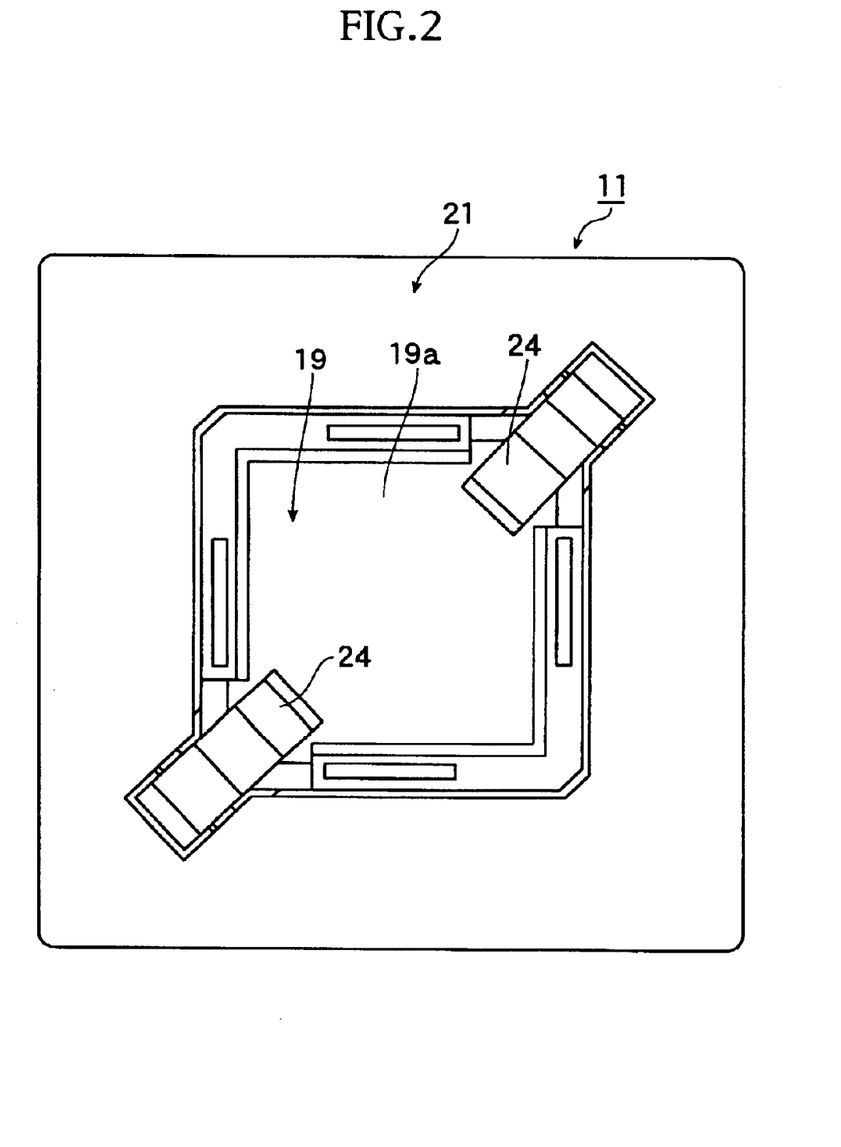
FIG. 2 is a plan view of the IC socket of the embodiment shown in FIG. 1.

The operation member 21 has approximately a rectangular frame shape as shown in FIGS. 1 and 2, and is formed with an opening 21a of a size capable of being inserted with the IC package 12, and the IC package 12 is inserted through this opening 21a and placed on the predetermined position of the mount surface portion 19a of the top plate 19.

For example, as shown in FIG. 1, the operation member 21 is disposed to be vertically movable with respect to the socket body 13 and is urged upward by means of spring 22.

The operation member 21 has four side surfaces from which engaging pieces 21b, each in shape of plate, extend downward along the side surfaces 13a of the socket body 13, respectively. Each of the engaging pieces 21b is formed with a rectangular opening window 21c into which a projection 13b formed to each of the side surfaces 13a of the socket body 13.

Figure 4:
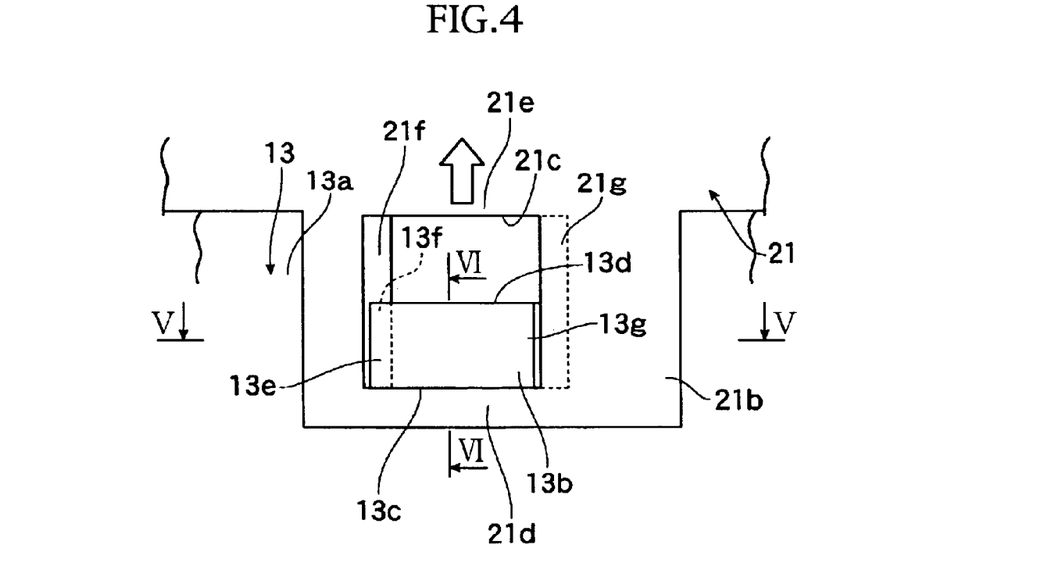
FIG. 4 is an illustration showing a front view of an engagement of a projection of a socket body of the IC socket and an engaging piece of an operation member in a case that the operation member takes uppermost position in its vertical movement.
Figure 7:
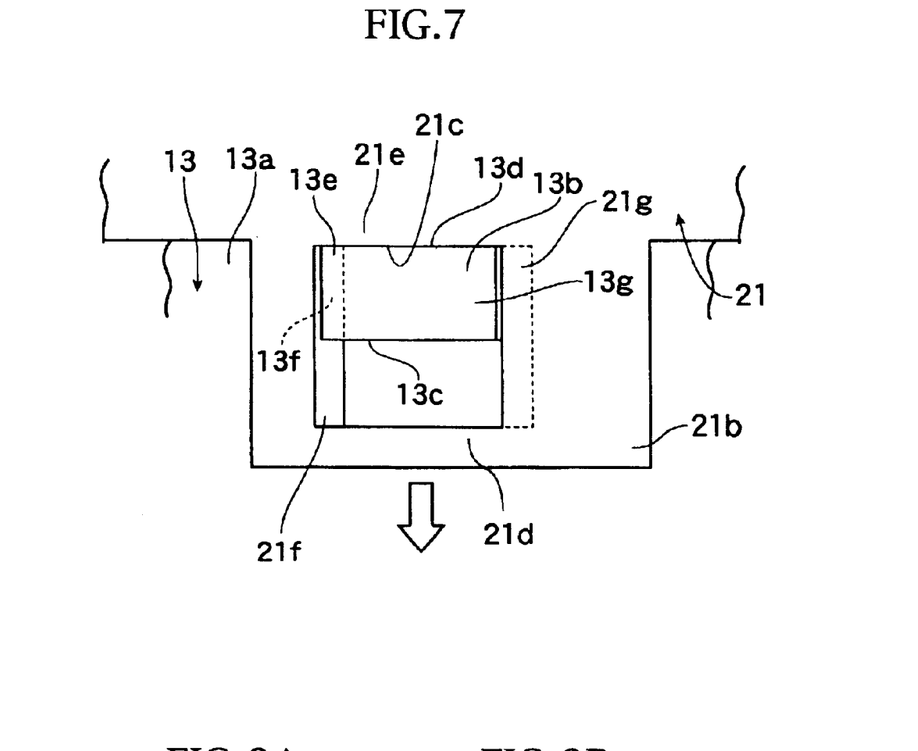
FIG. 7 is an illustration showing a front view of a state corresponding to that of FIG. 4 in a case that the operation member takes lowermost position in its vertical movement.

These opening window 21c and the projection 13b are formed so that the projection 13b can be movable therein by a predetermined amount in the vertical direction (i.e., contacting or separating direction). That is, as shown in FIGS. 1 and 4, at the uppermost position of the operation member 21 in its vertical movement, the lower side portion 21d of the opening window 21c of the operation member 21 abuts against the lower surface 13c of the projection 13b and the upward movement of the operation member 21 is therefore restricted. On the contrary, as shown in FIG. 7, at the lowermost position of the operation member 21 in its vertical movement, the upper side portion 21e of the opening window 21c of the operation member 21 abuts against the upper surface 13d of the projection 13b and the downward movement of the operation member 21 is therefore restricted.

Furthermore, as shown in FIGS. 4 to 7, a "coming-off prevention means" for preventing the engaging piece 21b from being disengaged from the projection 13b is provided between one side edge portion 21f, along the vertical direction, of the peripheral edge portion of the opening window 21c and corresponding one side edge portion 13e, along the vertical direction, of the projection 13b of the socket body 13.

Figure 5:
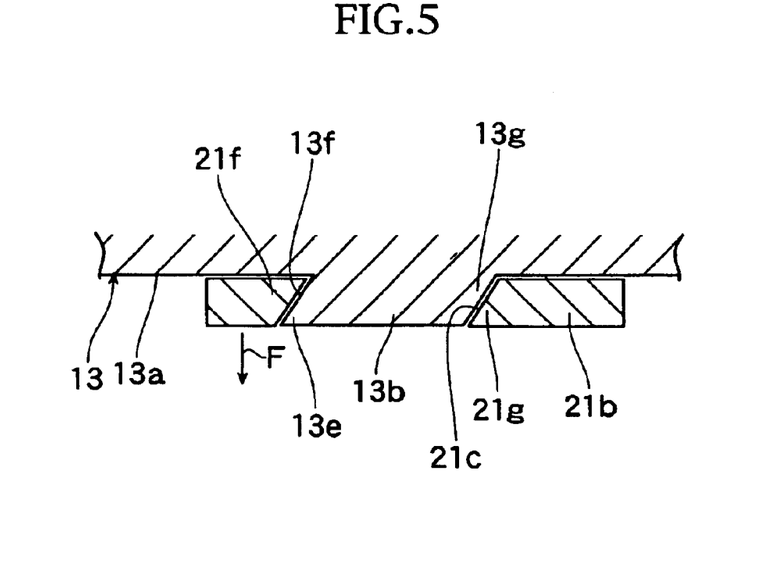
FIG. 5 is a sectional view taken along the line V—V in FIG. 4.

This "coming-off prevention means" includes a slide groove 13f formed to the side edge portion 13e of the projection 13b of the socket body 13, through oblique cutting operation, so as to provide approximately triangular shape in section as viewed in FIG. 5 and also includes a taper-shaped portion formed to one of the side edge portions 21f of the opening window 21c so as to be engageable with the slide groove 13f.

According to the structure of the coming-off prevention means mentioned above, the engaging piece 21b does not come off from the projection 13b in an arrow F direction in FIG. 5, i.e., outward the socket body. In addition, in this operation, the side edge portion 21f of the engaging piece 21b is moved vertically in the slide groove 13f so that the operation member 21 can be guided and moved vertically. Furthermore, another side edge portion 13g opposite to the above-mentioned one side edge portion 13e of the projection 13b of the socket body 13 and another side edge portion 21g opposite to the one side edge portion 21f of the engaging piece 21b of the operation member 21 also have a tapered portion substantially parallel to the slide groove 13f and the side edge portion 21f.

On the other hand, with reference to FIGS. 1 and 2, reference numeral 24 denotes a latch for pressing the IC package 12 rested on the mount surface portion 19a of the top plate 19. This latch 24 is rotated, i.e., pivoted, with respect to the socket body 13 in accordance with the vertical motion of the operation member 21. That is, when the operation member 21 is vertically lowered, the latch 24 is rotated to be opened upward so as to be retired from the IC package insertion range, and on the contrary, when the operation member 21 is moved upward, the latch 24 is rotated to be closed downward and then to press downward the IC package 12. The latch 24 is usually urged by means of spring, not shown, in a closing direction.

The IC socket 11 of the character and structure mentioned above is used in the following manner.

Prior to the setting of the IC package 12, the operation member 21 is urged upward by means of spring 22, and as shown in FIGS. 1 and 4, the lower side portion 21d of the engaging piece 21b of the operation member 21 abuts against the lower surface 13c of the projection 13b of the socket body 13, and then, the upward movement of the operation member 21 is restricted and stopped at its uppermost position.

In this state, in order to set the IC package 12 to the IC socket 11, the operation member 21 is to be depressed downward. During this downward movement of the operation member 21, the side edge portion 21f of the engaging piece 21b of the operation member 21 is moved downward in the slide groove 13f formed to the projection 13b of the socket body 13. That is, according to such movement, all the engaging pieces 21b of the operation member 21 are guided downward along the grooves 13f formed to the projection 13b of the socket body 13.

Then, at the lowermost position of the operation member 21, as shown in FIG. 7, the upper side portion 21e of the opening window 21c of the engaging piece 21b of the operation member 21 abuts against upper surface 13d of the projection 13b of the socket body 13 to thereby stop the lowering motion of the operation member 21.

In such use as mentioned above, the disengagement of the engaging pieces 21b from the projections 13b can be prevented at every position of the operation member 21 in its entire stroke by engaging the side edge portions 21f of the engaging pieces 21b of the operation member 21 with the slide grooves 13f of the socket body 13, while guiding the operation member 21 itself. Therefore, it is not necessary to independently provide a structure or member for preventing the outward coming-off of the operation member 21 from the socket body 13 during the motion stroke of the operation member 21 and for guiding the same, thus making simple the entire structure.

Figure 6:
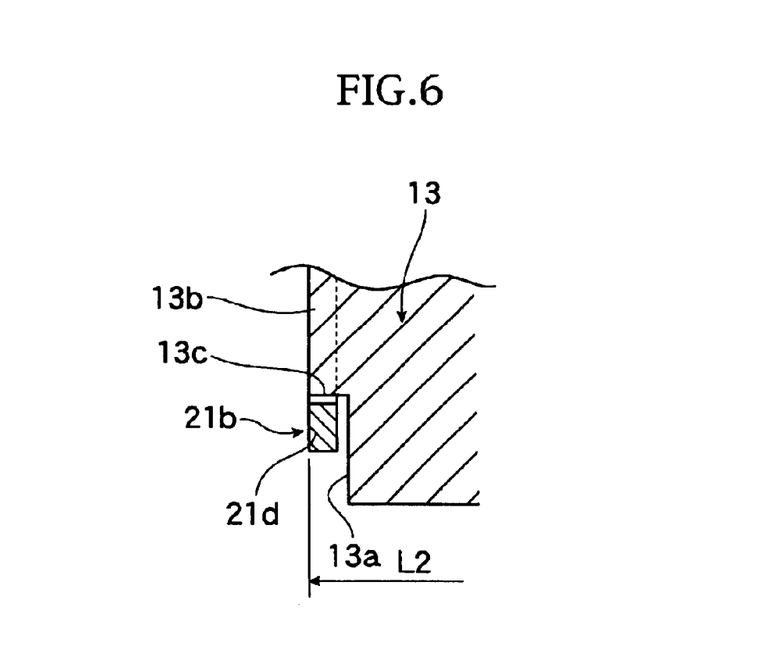
FIG. 6 is a sectional view taken along the line VI—VI in FIG. 4.

Furthermore, according to the described embodiment, the projection 13b of the socket body 13 is inserted into the opening window 21c of the engaging piece 21b, and as shown in the prior art of FIG. 10, the engaging piece 2a is not disposed outside the engagement portion (i.e., a portion to be engaged) 1b of the socket body 1, so that the outer size or dimension L2 of this embodiment shown, for example, in FIG. 6 can be made shorter in comparison with the outer dimension L1 of the conventional structure, thus making compact the IC socket 11 itself.

In addition, according to the described embodiment, since the amount of stroke of the operation member 21 can be determined by the sizes of the opening window 21c and the projection 13b, it is not necessary to additionally form a stopper structure at different position, thus also making simple the structure.

Then, according to the lowering motion of the operation member 21, the movable member 17 is moved rightward from the state shown in FIG. 8A to the state shown in FIG. 8B by a mechanism, not shown, according to the lowering motion of the operation member 21. In accordance with this sliding motion of the movable member 17, the movable side elastic pieces 15a of the contact pins 15 are elastically deformed by the pressing portion 17a of the movable member 17, and as shown in FIG. 8B, both the contact portions 15e and 15f of each contact pin 15 are opened to the extent capable of inserting the solder ball 12b of the IC package 12 therebetween.

At the same time, the latch 24 is depressed by an operating portion, not shown, of the operation member 21 so as to be rotated in its opening direction and is moved back to its retired position. Under the state, the IC package 12 is released from an automatic machine and guided and set to the predetermined position on the mount surface portion 19a of the top plate 19. According to such operation, each of the solder balls 12b of the IC package 12 is inserted into a space between the paired contact portions 15e and 15f, now opened, of the contact pin 15 in non-contact state.

Thereafter, the downward pressing force applied to the operation member 21 is released, and then, the operation member 21 is moved upward by the urging force of the spring 22, the latch 24 is rotated by this urging force in its closing direction, the IC package 12 is pressed, and the movable member 17 is returned to its original position by the urging force of the movable side elastic piece 15a, thereby clamping the solder ball 12b between both the contact portions 15e and 15f.

On the other hand, when it is required to remove the IC package 12 from its mounted state, the operation member 21 is lowered as like as that mentioned above. Then, the latch 24 is rotated in its retired position and the paired contact portions 15e and 15f of the contact pin 15 are separated from the solder ball 12b, so that the IC package 12 can be easily removed with a force weaker than a force for drawing the IC package 12 from the state that the solder ball 12b is clamped between the contact portions 15e and 15f.

It is further noted that the present invention is not limited to the described embodiment and many other changes and modifications may be made without departing from the scopes of the appended claims.

For example, in the preferred embodiment mentioned above, the present invention is applied to the mount structure between the socket body of an IC socket and an operation member thereof, but the present invention may be applied to a case of two members which are relatively movable in contacting or separating direction.

What is claimed is:

1. A mount structure for first and second members which are relatively movable in a reciprocating moving manner in a direction contacting to or separating from each other when the first and second members are engaged with each other by the mount structure, wherein the first member is provided with an engaging piece in form of a plate so as to extend along a side surface of the second member, said engaging piece being formed with an opening window, and the second member is provided, at a side surface thereof, with a projection which is to be inserted into the opening window and capable of relative movement with respect to the opening window when the projection is inserted into the opening and reciprocating moved, said opening window having a peripheral edge including a side edge portion extending along a contacting or separating direction, said projection having a side edge portion extending along the contacting or separating direction, and a coming-off prevention part which prevents the engaging piece from coming off from the projection is provided between said side edge portion of the opening window peripheral edge and said side edge portion of the projection.

2. The mount structure according to claim 1, wherein said coming-off prevention part includes a slide groove formed to the side edge portion of the projection and said side edge portion of the opening window peripheral edge is inserted into the slide groove formed to the side edge portion of the projection.

3. The mount structure according to claim 1, wherein when the first and second members are relatively moved in the separating direction, one side portion of the peripheral edge of the opening window abuts against the projection and then the relative movement stops and, on the other hand, when the first and second members are relatively moved in the contacting direction, another one side portion of the peripheral edge of the opening window abuts against the projection and then the relative movement stops.

4. The mount structure according to claim 1, wherein said first member is a socket body of an IC socket and said second member is an operation member disposed to be movable with respect to the socket body, said socket body being provided with a contact pin which is electrically connected to a terminal of an IC package and when said operation member is moved, the contact pin is elastically deformed so as to be contacted to or separated from the terminal.

5. A mount structure of a socket for an electrical part in which the socket includes a socket body and an operation member mounted to the socket body which are relatively movable in a reciprocating moving manner in a direction contacting to or separating from each other when the socket body and the operation member are engaged with each other by the mount structure, wherein said operation member is provided with an elastic piece extending from a side surface of the operation member along a side surface of the socket body, said elastic piece being formed with an opening, and said socket body is provided with a projection projecting from the side surface thereof so as to be inserted into the opening of the elastic piece, said opening having a size in which the projection is movable by a predetermined amount.

6. The mount structure according to claim 5, wherein said operation member has a rectangular frame structure and said elastic piece extends from each side surface of the operation member along each side surface of the socket body.

7. The mount structure according to claim 1, wherein the peripheral edge of the opening window slides on the side edge portion of the projection.

8. The mount structure according to claim 1, wherein upper and lower peripheral edges of the opening window comprise a straight surface and upper and lower peripheral edges of the projection comprise a straight surface to obtain a surface-to-surface contact between the opening window and the projection.

9. A mount structure comprising:

a first member having an engaging piece in form of a plate extending downward in a vertical direction, wherein the engaging piece comprises an opening window having a peripheral edge including a side edge portion extending in a vertical direction;

a second member having a projection at a side surface thereof to be inserted into the opening window and movable therein by a predetermined amount in a vertical direction, wherein the projection comprises a side edge portion extending along in a vertical direction; and a coming-off prevention part provided between the side edge portion of the peripheral edge of the opening window and the side edge portion of the projection, to prevent the engaging piece from detaching from the projection, wherein the first and the second members engage with each other and move in a reciprocating manner in a vertical direction contacting to or separating from each other.

10. The mount structure according to claim 9, wherein the coming-off prevention part comprises a slide groove formed to the side edge portion of the projection, wherein the side edge portion of the peripheral edge of the opening window is inserted into the slide groove.

11. The mount structure according to claim 9, wherein when the first and second members are relatively moved in a separating direction, an upper side portion of the peripheral edge of the opening window abuts against the projection, to prevent movement of the first and second members; and when the first and second members are relatively moved in a contacting direction, a lower side portion of the peripheral edge of the opening window abuts against the projection to prevent movement of the first and second members.

* * * * *